US011899971B2

(12) United States Patent
Ning et al.

(10) Patent No.: US 11,899,971 B2
(45) Date of Patent: *Feb. 13, 2024

(54) METHOD FOR READING AND WRITING AND MEMORY DEVICE

(71) Applicant: CHANGXIN MEMORY TECHNOLOGIES, INC., Hefei (CN)

(72) Inventors: Shuliang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 329 days.

This patent is subject to a terminal disclaimer.

(21) Appl. No.: 17/342,498

(22) Filed: Jun. 8, 2021

(65) Prior Publication Data
US 2021/0311666 A1 Oct. 7, 2021

Related U.S. Application Data

(63) Continuation of application No. PCT/CN2020/127584, filed on Nov. 9, 2020.

(30) Foreign Application Priority Data

Apr. 1, 2020 (CN) .......................... 202010250426.8

(51) Int. Cl.
G06F 3/06 (2006.01)

(52) U.S. Cl.
CPC .......... G06F 3/0659 (2013.01); G06F 3/0604 (2013.01); G06F 3/0679 (2013.01)

(58) Field of Classification Search
CPC ..... G06F 3/0659; G06F 3/0604; G06F 3/0679
(Continued)

(56) References Cited

U.S. PATENT DOCUMENTS 5,841,711 A 11/1998 Watanabe
5,996,096 A 11/1999 Dell et al.
(Continued)

FOREIGN PATENT DOCUMENTS

CN 1832049 A 9/2006
CN 101145372 A 3/2008
(Continued)

OTHER PUBLICATIONS

State Intellectual Property Office of the People's Republic of China, First Office Action issued in Application No. 202010250011.0, dated Feb. 15, 2023, 9 pages.
(Continued)

Primary Examiner — Than Nguyen
(74) Attorney, Agent, or Firm — Kilpatrick Townsend & Stockton LLP

(57) ABSTRACT

The embodiments provide a method for reading and writing and a memory device. The method includes: applying a read command to the memory device, the read command pointing to address information; reading data to be read out from a memory cell corresponding to the address information pointed to by the read command; and storing the address information pointed to by the read command into a memory bit of a preset memory space if an error occurs in the data to be read out, wherein the preset memory space is provided with a plurality of the memory bits, and each of the plurality of memory bits is associated with a spare memory cell.

10 Claims, 6 Drawing Sheets

(58) Field of Classification Search
USPC .......................................................... 711/154
See application file for complete search history.

(56) References Cited

U.S. PATENT DOCUMENTS

| | | | |
|---|---|---|---|
| 9,037,928 B2 | 5/2015 | Kleveland et al. | |
| 9,741,455 B1 | 8/2017 | Park | |
| 10,643,668 B1 | 5/2020 | Poudyal et al. | |
| 11,527,301 B2* | 12/2022 | Ning | G11C 29/18 |
| 2002/0097613 A1 | 7/2002 | Raynham | |
| 2002/0169996 A1 | 11/2002 | King et al. | |
| 2003/0133336 A1 | 7/2003 | Chen | |
| 2003/0156469 A1 | 8/2003 | Viehmann et al. | |
| 2004/0003315 A1 | 1/2004 | Lakhani et al. | |
| 2006/0140027 A1 | 6/2006 | Tominaga | |
| 2007/0113155 A1 | 5/2007 | Takahashi | |
| 2007/0294570 A1 | 12/2007 | Polisetti et al. | |
| 2008/0181035 A1 | 7/2008 | Kawasumi | |
| 2010/0229033 A1 | 9/2010 | Maeda et al. | |
| 2010/0269000 A1 | 10/2010 | Lee | |
| 2010/0332895 A1 | 12/2010 | Billing et al. | |
| 2010/0332950 A1* | 12/2010 | Billing | G06F 11/1008 711/E12.007 |
| 2011/0119558 A1 | 5/2011 | Koshiyama et al. | |
| 2012/0166710 A1 | 6/2012 | Ou | |
| 2012/0254511 A1 | 10/2012 | Yeh | |
| 2013/0179724 A1 | 7/2013 | Cordero et al. | |
| 2014/0075265 A1 | 3/2014 | Hung et al. | |
| 2014/0376320 A1 | 12/2014 | Loh et al. | |
| 2015/0019804 A1 | 1/2015 | Nemazie et al. | |
| 2015/0127972 A1 | 5/2015 | Chun et al. | |
| 2015/0143198 A1 | 5/2015 | Chun et al. | |
| 2015/0186198 A1 | 7/2015 | Dong et al. | |
| 2015/0293809 A1 | 10/2015 | Liang et al. | |
| 2015/0347254 A1 | 12/2015 | Jones et al. | |
| 2015/0363425 A1 | 12/2015 | Li et al. | |
| 2016/0147599 A1 | 5/2016 | Kim | |
| 2016/0357462 A1 | 12/2016 | Nam et al. | |
| 2016/0364153 A1 | 12/2016 | Nam et al. | |
| 2017/0123879 A1 | 5/2017 | Donlin | |
| 2017/0132075 A1 | 5/2017 | Zastrow et al. | |
| 2017/0139839 A1 | 5/2017 | Ke | |
| 2017/0262178 A1 | 9/2017 | Hashimoto | |
| 2017/0308433 A1 | 10/2017 | Kwon et al. | |
| 2017/0372799 A1 | 12/2017 | Bacchus | |
| 2018/0158535 A1* | 6/2018 | Kim | G11C 29/783 |
| 2019/0129776 A1 | 5/2019 | Hsiao et al. | |
| 2019/0371391 A1 | 12/2019 | Cha et al. | |
| 2019/0377631 A1 | 12/2019 | Hattori | |
| 2019/0385693 A1 | 12/2019 | Shin et al. | |
| 2020/0004652 A1 | 1/2020 | Niu et al. | |
| 2021/0055981 A1 | 2/2021 | Miller et al. | |
| 2021/0311836 A1 | 10/2021 | Ning et al. | |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102004698 A | 4/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105723344 A | 6/2016 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| TW | 201706842 A | 2/2017 |
| WO | 2012019475 A1 | 2/2012 |

OTHER PUBLICATIONS

State Intellectual Property Office of the People's Republic of China, First Office Action issued in Application No. 202010250426.8, dated Feb. 16, 2023, 12 pages.
European Patent Office, Office Action Issued in Application No. 20928300.1, dated Feb. 22, 2023, Germany, 11 pages.
State Intellectual Property Office of the People's Republic of China, First Office Action Issued in related Application No. 202010249668.5, dated Jan. 12, 2023, 8 pages.
State Intellectual Property Office of the People's Republic of China, First Office Action Issued in related Application No. 202010249989.5, dated Jan. 19, 2023, 10 pages.
State Intellectual Property Office of the People's Republic of China, First Office Action Issued in related Application No. 202010250023.3, dated Jan. 19, 2023, 12 pages.
European Patent Office, Extended European Search Report Issued in Application No. 20926358.1, dated Jul. 17, 2023, Germany, 7 pages.
United States Patent and Trademark Office, Non-Final office action issued in related U.S. Appl. No. 17/363,013 dated Aug. 3, 2023, total 11 pages.
United States Patent and Trademark Office, Non-Final office action issued in related U.S. Appl. No. 17/310,495 dated Jul. 31, 2023, total 14 pages.
United States Patent and Trademark Office, Non-Final office action issued in related U.S. Appl. No. 17/347,525 dated Aug. 2, 2023, total 9 pages.
State Intellectual Property Office of the People's Republic of China, Office Action Issued in Application No. 202010250008.9, dated Jul. 2001, 8 pages.
United States Patent and Trademark Office, Non-Final office action issued in related U.S. Appl. No. 17/396,692 dated Jul. 7, 2023, total 10 pages.
European Patent Office, Summons to attend oral proceedings issued in Application No. 20928300.1, Nov. 15, 2023, Germany, 11 pages.

* cited by examiner

METHOD FOR READING AND WRITING AND MEMORY DEVICE

CROSS REFERENCE

This application is a continuation of PCT/CN2020/127584, filed Nov. 9, 2020, which claims priority to Chinese Patent Application No. 202010250426.8, titled "METHOD FOR READING AND WRITING AND MEMORY DEVICE" and filed on Apr. 1, 2020, the entire contents of which are incorporated herein by reference.

TECHNICAL FIELD

The present disclosure relates to the field of semiconductor memory technologies, and more particularly, to a method for reading and writing and a memory device.

BACKGROUND

Semiconductor memories are memory components for storing various data and information. With the increase in circuit complexity, various forms of memory devices are inevitably prone to produce defective or damaged memory cells during manufacturing or during use, resulting in reduced reliability and lifespan of the semiconductor memory devices.

Therefore, how to improve the reliability of the memory devices and prolong the lifespan of the memory devices has become an urgent problem to be solved at present.

SUMMARY

A technical problem to be solved by the present disclosure is to provide a method for reading and writing and a memory device to greatly improve the reliability of the memory device and prolong the lifespan of the memory device.

To solve the above technical problem, the present disclosure provides a method for reading and writing. The method includes: applying a read command to the memory device, the read command pointing to address information; reading data to be read out from a memory cell corresponding to the address information pointed to by the read command; and storing the address information pointed to by the read command into a memory bit of a preset memory space if an error occurs in the data to be read out. The preset memory space is provided with a plurality of the memory bits, and each of the plurality of memory bits is associated with a spare memory cell.

Further, the address information pointed to by the read command is not stored in the memory bit of the preset memory space if no error occurs in the data to be read out.

Further, the step of reading data to be read out from a memory cell corresponding to the address information pointed to by the read command also includes: reading, from the memory cell corresponding to the address information pointed to by the read command, a first error correction code (ECC) corresponding to the data to be read out. A method for determining whether an error occurs in the data to be read out includes: decoding the first ECC to determine whether the error occurs in the data to be read out.

Further, a write command is applied to the memory device, and address information pointed to by the write command is compared with the address information stored in the preset memory space. A write operation is performed on the memory cell corresponding to the address information pointed to by the write command if the address information pointed to by the write command is different from the address information stored in the preset memory space. If the address information pointed to by the write command is identical to the address information stored in the preset memory space, it is stopped performing the write operation on the memory cell corresponding to the address information pointed to by the write command, and a write operation is performed on the spare memory cell corresponding to a first memory bit where the address information is stored in the preset memory space.

Further, the step of performing a write operation on the memory cell corresponding to the address information pointed to by the write command also includes: forming a second ECC corresponding to data to be written in the write operation, and writing the second ECC together with the data to be written into the memory cell corresponding to the address information pointed to by the write command.

Further, after the read command is applied to the memory device, and before the data to be read out is read from the memory cell corresponding to the address information pointed to by the read command, the method also includes: comparing address information pointed to by the read command with the address information stored in the preset memory space; and performing a read operation on the memory cell corresponding to the address information pointed to by the read command if the address information pointed to by the read command is different from the address information stored in the preset memory space.

Further, if the address information pointed to by the read command is identical to the address information stored in the preset memory space, it is stopped performing the read operation on the memory cell corresponding to the address information pointed to by the read command, and a read operation is performed on the spare memory cell corresponding to a first memory bit where the address information is stored in the preset memory space.

Further, when the error occurs in the data to be read out, if the data to be read out is corrected, the corrected data is stored into the spare memory cell; and if the data to be read out is not corrected, the data to be read out is stored into the spare memory cell.

The present disclosure also provides a memory device, which includes: a command receiving unit, configured to receive a read command or a write command; a memory cell, configured to correspond to address information pointed to by the read command or write command; a spare memory cell; a preset memory space, provided with a plurality of memory bits configured for storing address information corresponding to a memory cell with data error, wherein each of the plurality of memory bits is associated with one spare memory cell; and an execution unit, configured to perform a read operation or a write operation on the memory cell or the spare memory cell.

Further, the memory device also includes an ECC decoding unit, wherein the ECC decoding unit is configured to decode a first ECC corresponding to data to be read out in the read operation and to form a second ECC corresponding to data to be written in the write operation.

Further, the memory device also includes a comparison unit, wherein the comparison unit is connected to the command receiving unit and the preset memory space, and the comparison unit is configured to compare address information pointed to by the read command or write command with the address information stored in the preset memory space.

Further, the execution unit is also connected to the comparison unit, and the execution unit is configured to perform a read operation or a write operation on the memory cell corresponding to the address information pointed to by the read command or write command according to a result outputted by the comparison unit, or to stop performing the read operation or the write operation on the memory cell corresponding to the address information pointed to by the read command or write command, and to perform a read operation or a write operation on the spare memory cell corresponding to a first memory bit where the address information is stored in the preset memory space.

Further, the memory device also includes a logic layer and at least one memory layer. The command receiving unit and the execution unit are arranged in the logic layer, the preset memory space is arranged in the logic layer or the memory layer, the memory cell is arranged in the memory layer, and the spare memory cell is arranged in the memory layer or the logic layer.

The present disclosure has advantages as below. Address information corresponding to a memory cell with data error is differentiated, in real time, from address information corresponding to a memory cell without data error by using the preset memory space, and the memory cell with data error is replaced by the spare memory cell. In subsequent read and write operations, based on a fact whether address information pointed to by the read command or write command is located in the preset memory space, it is selected to perform a read operation or write operation on the memory cell corresponding to the address information or to perform a read operation or write operation on the spare memory cell, which avoids data errors or data loss, thereby greatly improving the reliability of the memory device and prolonging the lifespan of the memory device.

DETAILED DESCRIPTION

Figure 1:
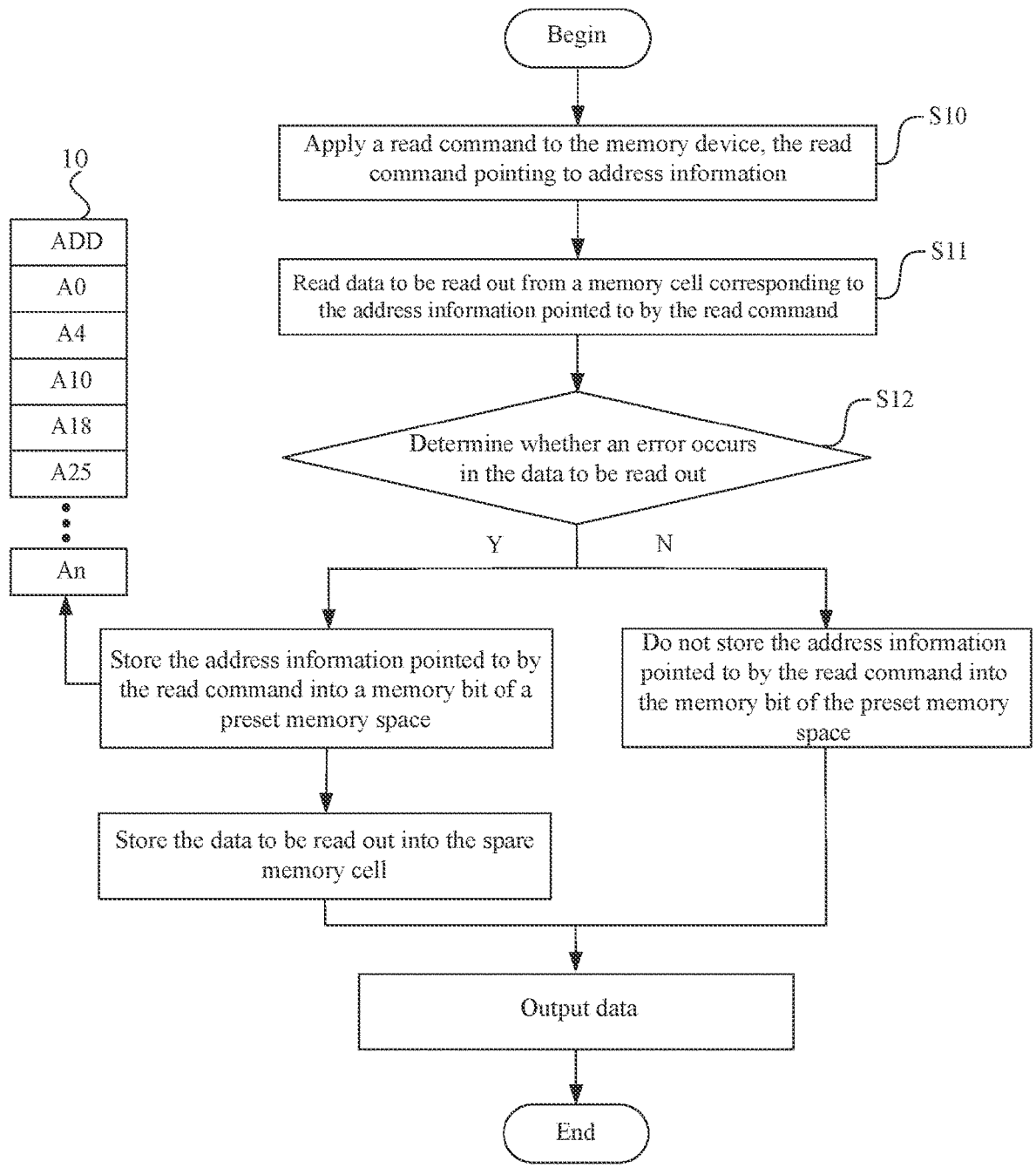
FIG. 1 is a schematic flow diagram of a method for reading and writing according to a first embodiment of the present disclosure.

Embodiments of a method for reading and writing and a memory device provided by the present disclosure are described below in detail with reference to the accompanying drawings.

A common method for improving reliability of a memory device includes: encoding data as an error correction code (ECC) before the data is written into the memory device, and simultaneously storing the data and the ECC into the memory device. When reading, the data and the ECC are read simultaneously, and the ECC is decoded to restore data where an error likely occurs.

However, it is found that the ECC can only correct data when the data is read, and in a memory there still exists a memory cell with data error. In a subsequent data storage process, if at least one memory cell with data error reoccurs in a memory segment corresponding to the above memory cell with data error, in this memory segment there may exist at least two memory cells with data error. However, the ECC will be unable to correct the error, causing this memory segment to be unserviceable, or even causing the memory device to be unserviceable, thereby having a negative effect on the reliability and lifespan of the memory device.

By study, it is found that when a user uses the memory device, it may be avoided performing a read/write operation on the memory cell with data error (i.e., an invalid memory cell) by differentiating the memory cell with data error in real time and replacing the memory cell with data error by a spare memory cell, which can greatly improve the reliability of the memory device and prolong the lifespan of the memory device. Therefore, the present disclosure provides a method for reading and writing, which can differentiate a memory cell with data error in real time, and replace the memory cell with data error by a spare memory cell.

In a first embodiment of the method for reading and writing provided by the present disclosure, when performing a read operation, address information corresponding to a memory cell where an error occurs in data to be read out is stored in a preset memory space to differentiate the memory cell where the error occurs in the data to be read out from a memory cell where no error occurs in the data to be read out, and the memory cell with data error is replaced by a spare memory cell. In some embodiments, with reference to FIG. 1, a schematic flow diagram of the method for reading and writing according to the first embodiment of the present disclosure is illustrated, and the method for reading and writing includes following steps.

In Step S10, a read command is applied to the memory device, wherein the read command points to address information. For example, the address information pointed to by the read command is denoted by A0.

In Step S11, data to be read out is read from a memory cell corresponding to the address information pointed to by the read command. For example, data to be read out is read from a memory cell corresponding to the address information A0.

In Step S12, it is determined whether an error occurs in the data to be read out.

If the error occurs in the data to be read out, this means that the memory cell is invalid. In this case, the address information pointed to by the read command is stored into a memory bit ADD of a preset memory space 10, the preset memory space is provided with a plurality of the memory bits ADD, and each of the plurality of memory bits ADD is associated with one spare memory cell. That is, the address information corresponding to an invalid memory cell is stored into the preset memory space, and the invalid memory cell is replace by the spare memory cell to improve the reliability of the memory device.

For example, if an error occurs in the data to be read out read from a memory cell corresponding to the address information A0 pointed to by the read command, the address information A0 pointed to by the read command is stored into the memory bit ADD of the preset memory space 10, and the memory cell corresponding to the address information A0 is replaced by one spare memory cell associated with the memory bit ADD. If an error occurs in the data to be read out read from a memory cell corresponding to address information A4 pointed to by the read command, the address information A4 pointed to by the read command is stored into the memory bit ADD of the preset memory space 10, and the memory cell corresponding to the address information A4 is replaced by one spare memory cell associated with the memory bit ADD.

The preset memory space 10 may be a structure having memory function known to those skilled in the art, such as a static random access memory (SRAM), a dynamic random access memory (DRAM), a magnetic random access memory (MRAM), a register, a latch, and a flip-flop, etc.

The preset memory space 10 may include a plurality of memory bits ADD, for example, 100 memory bits, 150 memory bits, and 200 memory bits, etc. The number of the plurality of memory bits ADD may be set according to actual demands. In the step of storing the address information pointed to by the read command into a memory bit ADD of the preset memory space, the address information pointed to by the read command may be sequentially or randomly stored into the plurality of memory bits ADD of the preset memory space 10, and each of the plurality of memory bits ADD is associated with one spare memory cell.

For example, in this embodiment, the address information corresponding to the memory cells with data error is denoted by A0, A4, A10, A18, A25, . . . An. In the preset memory space 10, the address information is sequentially stored into a first memory bit, a second memory bit, a third memory bit, and so on. Each of the plurality of memory bits ADD is associated with one spare memory cell. For another example, in another embodiment of the present disclosure, address information corresponding to memory cells where data errors occur is denoted by A0, A4, A10, A18, A25, . . . An. In the preset memory space 10, the address information may be randomly stored into any memory bit of the preset memory space 10. For example, A0 is stored into a fifth memory bit, A4 is stored into the second memory bit, A10 is stored into a sixth memory bit, and so on. Each of the plurality of memory bits ADD is associated with one spare memory cell.

It is to be understood that whether the address information pointed to by the read command is sequentially stored into the plurality of memory bits ADD of the preset memory space 10, or the address information pointed to by the read command is randomly stored into the plurality of memory bits ADD of the preset memory space 10, different memory bits ADD are associated with different spare memory cells, to ensure that the spare memory cells associated with the address information are not repetitive, thereby avoiding data storage error.

Further, there are a variety of methods for associating the first memory bit with one spare memory cell. For example, the first memory bit is directly associated with the spare memory cell through circuit design, or the first memory bit is associated with the spare memory cell through an identification code that can identify the spare memory cell. Those skilled in the art may also use other conventional methods, which are not limited in the present disclosure.

Further, when the error occurs in the data to be read out, if the data to be read out is corrected, the corrected data is stored into the spare memory cell; and if the data to be read out is not corrected, the data to be read out is stored into the spare memory cell. For example, in this embodiment, as shown in FIG. 1, the data to be read out is not corrected, and thus the data to be read out is stored into the spare memory cell. In other embodiments of the present disclosure, if the data to be read out is corrected, the corrected data is stored into the spare memory cell.

If no error occurs in the data to be read out, this means that the memory cell is valid. In this case, the address information pointed to by the read command is not stored into the memory bit ADD of the preset memory space 10.

For example, if no error occurs in the data to be read out read from a memory cell corresponding to address information A1 pointed to by a read command, the address information A1 pointed to by the read command is not stored into a memory bit ADD of the preset memory space 10. If no error occurs in the data to be read out read from a memory cell corresponding to address information A2 pointed to by a read command, the address information A2 pointed to by the read command is not stored into a memory bit ADD of the preset memory space 10.

Further, the present disclosure also provides a method for determining whether an error occurs in the data to be read out. In some embodiments, the step of reading data to be read out from a memory cell corresponding to the address information pointed to by the read command further includes: reading, from the memory cell corresponding to the address information pointed to by the read command, a first error correction code (ECC) corresponding to the data to be read out. For example, number of bits of data read from the memory cell corresponding to the address information pointed to by the read command is 64b+8b, wherein 64b represents the number of bits of the data to be read out, and 8b represents the number of bits of the first ECC. According to a corresponding algorithm, the first ECC is decoded to restore data where an error likely occurs. The algorithm belongs to the existing technologies, and thus is not to be described in detail. Therefore, it may be determined whether an error occurs in the data to be read by decoding the first ECC.

The present disclosure enumerates a method for determining whether an error occurs in the data to be read out by decoding the first ECC. This method includes following steps. The data to be read out is re-encoded to form a new ECC, and an XOR comparison is performed between the new ECC and the first ECC. If the new ECC is consistent with the first ECC in each bit, this means that no error occurs in the data to be read out, and the memory cell is valid. In this case, the address information corresponding to the memory cell is not stored into the preset memory space. If the new ECC is inconsistent with the first ECC, this means that an error occurs in the data to be read out, and the memory cell is invalid. In this case, the address information corresponding to the memory cell is stored into the preset memory space.

If no error occurs in the data to be read out, the data to be read out is used as output data of the memory device. If an error occurs in the data to be read out, the first ECC may be employed to correct the data to be read out, the corrected data is used as the output data of the memory device, and the corrected data is stored into the corresponding spare memory cell.

According to the method for reading and writing provided by the present disclosure, address information corresponding to a memory cell with data error is differentiated, in real time, from address information corresponding to a memory cell without data error by using the preset memory space 10, and the memory cell with data error is replaced by the spare memory cell. In a subsequent read/write operation, based on a fact whether address information pointed to by the read command or write command is located in the preset memory space 10, it is selected to perform a read operation or write operation on the memory cell corresponding to the address information or to perform a read operation or write operation on the spare memory cell, which avoids data errors or data loss, thereby greatly improving the reliability of the memory device and prolonging the lifespan of the memory device.

The method for reading and writing provided by the present disclosure also provides a second embodiment. After applying a read command to the memory device, and before reading data to be read out from a memory cell corresponding to the address information pointed to by the read command, the method for reading and writing also includes a comparison step. In some embodiments, with reference to FIG. 2, a schematic flow diagram of the method for reading and writing according to the second embodiment of the present disclosure is illustrated.

In Step S20, a read command is applied to the memory device, wherein the read command points to address information.

In Step S21, the address information pointed to by the read command is compared with the address information stored in the preset memory space 20. That is, it is determined whether the address information pointed to by the read command is identical to the address information stored in the preset memory space 20.

If the address information pointed to by the read command is different from the address information stored in a memory bit ADD of the preset memory space 20, this means that the address information pointed to by the read command is not stored in the memory bit ADD of the preset memory space 20. In this case, the memory cell corresponding to the address information pointed to by the read command is a valid memory cell, and a read operation is performed on the memory cell corresponding to the address information pointed to by the read command, i.e., Step S22 is performed.

For example, the address information pointed to by the read command is denoted by A1, and the address information A1 pointed to by the read command is compared with the address information stored in the preset memory space 20. If the address information A1 pointed to by the read command is different from the address information stored in any memory bit ADD of the preset memory space 20, this means that the address information A1 pointed to by the read command is not stored into the memory bit ADD of the preset memory space 20. In this case, the read operation is performed on the memory cell corresponding to the address information A1 pointed to by the read command, i.e., Step S22 is performed. In Step S22, the read command points to the address information A1.

If the address information pointed to by the read command is identical to the address information stored in the preset memory space 20, this means that the address information pointed to by the read command is stored in the memory bit ADD of the preset memory space 20. In this case, it is stopped performing the read operation on the memory cell corresponding to the address information pointed to by the write command, and Step S23 is performed. For example, if address information A4 pointed to by the read command is identical to the address information stored in the preset memory space 20, this means that the address information A4 pointed to by the read command is stored into a memory bit ADD of the preset memory space 20. In this case, it is stopped performing the read operation on the memory cell corresponding to the address information pointed to by the write command, and Step S23 is performed.

In Step S22, the data to be read out is read from the memory cell corresponding to the address information pointed to by the read command. For example, the data to be read out is read from the memory cell corresponding to the address information A1 pointed to by the read command. This step is the same as Step S11 in the first embodiment. Step S24 is performed after Step S22 is performed.

In Step S23, the read operation is performed on the spare memory cell corresponding to the memory bit ADD where the address information is stored in the preset memory space 20. For example, if the address information A4 pointed to by the read command is identical to the address information stored in the preset memory space 20, this means that the address information A4 pointed to by the read command is stored in the memory bit ADD of the preset memory space 20. In this case, it is stopped performing the read operation on the memory cell corresponding to the address information pointed to by the write command, and the read operation is performed on the spare memory cell corresponding to the memory bit ADD where the address information A4 is stored in the preset memory space 10.

Step S25 is performed after Step S232 is performed.

In Step S24, it is determined whether an error occurs in the data to be read out. This step is the same as Step S12 in the first embodiment. If the error occurs in the data to be read out, this means that the memory cell is invalid. In this case, the address information pointed to by the read command is stored into the memory bit ADD of the preset memory space 20. However, if no error occurs in the data to be read out, this means that the memory cell is valid. In this case, the address information pointed to by the read command is not stored into the memory bit ADD of the preset memory space 20.

Figure 2:
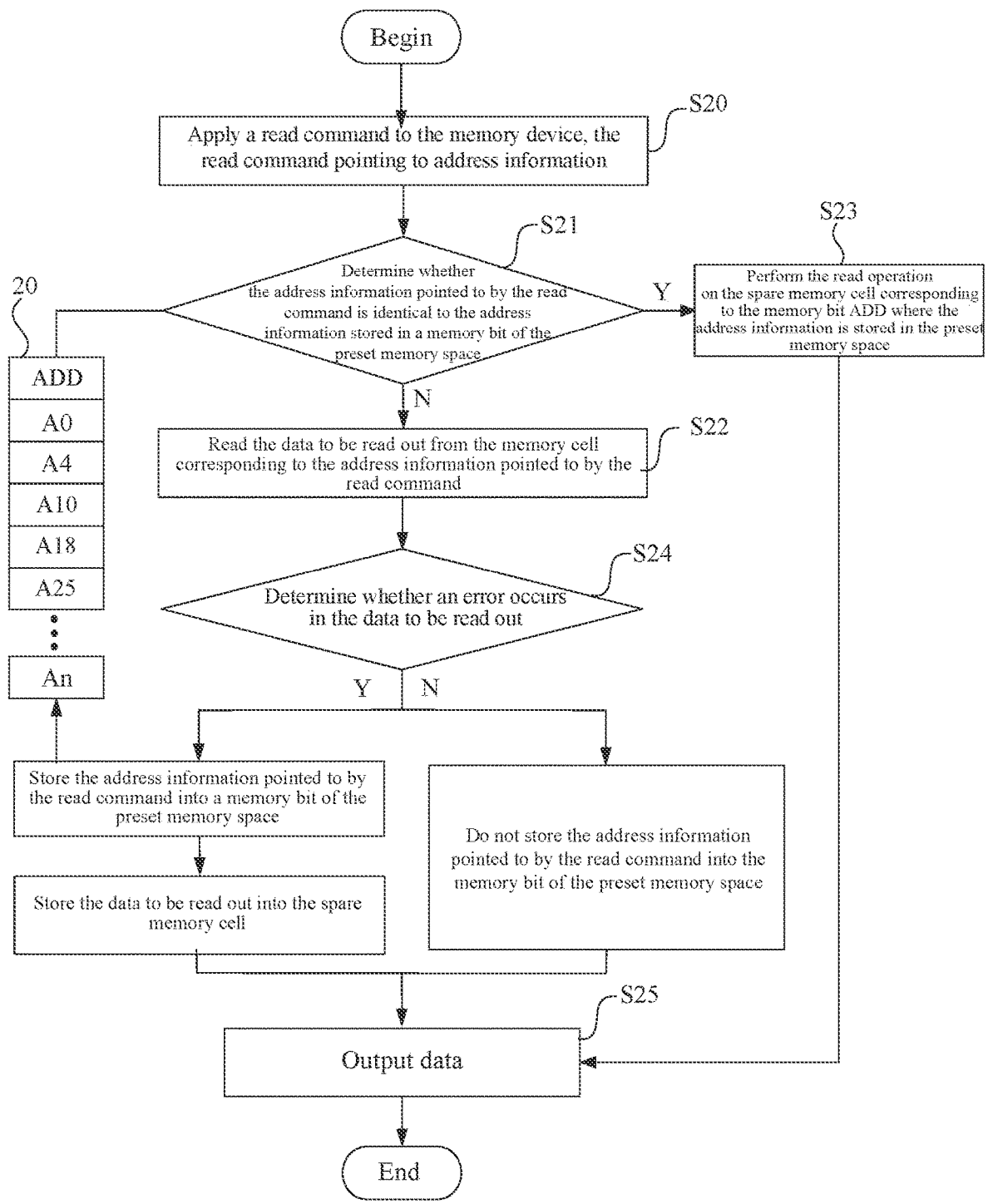
FIG. 2 is a schematic flow diagram of a method for reading and writing according to a second embodiment of the present disclosure.

Further, when the error occurs in the data to be read out, if the data to be read out is corrected, the corrected data is stored into the spare memory cell; and if the data to be read out is not corrected, the data to be read out is stored into the spare memory cell. For example, in this embodiment, as shown in FIG. 2, the data to be read out is not corrected, and thus the data to be read out is stored into the spare memory cell. In other embodiments of the present disclosure, if the data to be read out is corrected, the corrected data is stored into the spare memory cell. In Step S25, data is outputted. In this step, the outputted data may be data stored in the spare memory cell, and may be corrected or uncorrected data to be read out in the memory cell.

It is to be noted that in another embodiment, after Step S23 is performed, it may be continued to determine whether an error occurs in data read out from a corresponding spare memory cell. The data is outputted if no error occurs in the data read out. If the error occurs in the data read out, a memory location of the address information pointed to by the read command in the preset memory space is changed, i.e., the address information pointed to by the read command is stored in another memory bit, and the data to be read out or the corrected data to be read out may be stored into a spare memory cell associated with the other memory bit.

In the second embodiment, after a read command is applied to the memory device, the address information pointed to by the read command is compared with the address information stored in the preset memory space 20 to determine whether the address information pointed to by the read command is located in the preset memory space 20, such that the read command may be selectively executed on the memory cell corresponding to the address information pointed to by the read command or the spare memory cell. In this way, the reliability of the memory device can be improved. In addition, after the data to be read out is read out, it may be selected whether to store the address information of the memory cell into a memory bit ADD of the preset memory space 20 according to a fact whether an error occurs in the data to be read out, such that address information corresponding to a memory cell with data error is differentiated, in real time, from address information corresponding to a memory cell without data error by using the preset memory space, and the memory cell with data error is replaced by the spare memory cell if an error occurs in the data to be read out. Furthermore, the corrected data is stored into the spare memory cell to provide a basis for a subsequent read/write operation, which further improves the reliability of the memory device and prolongs the lifespan of the memory device.

Figure 3:
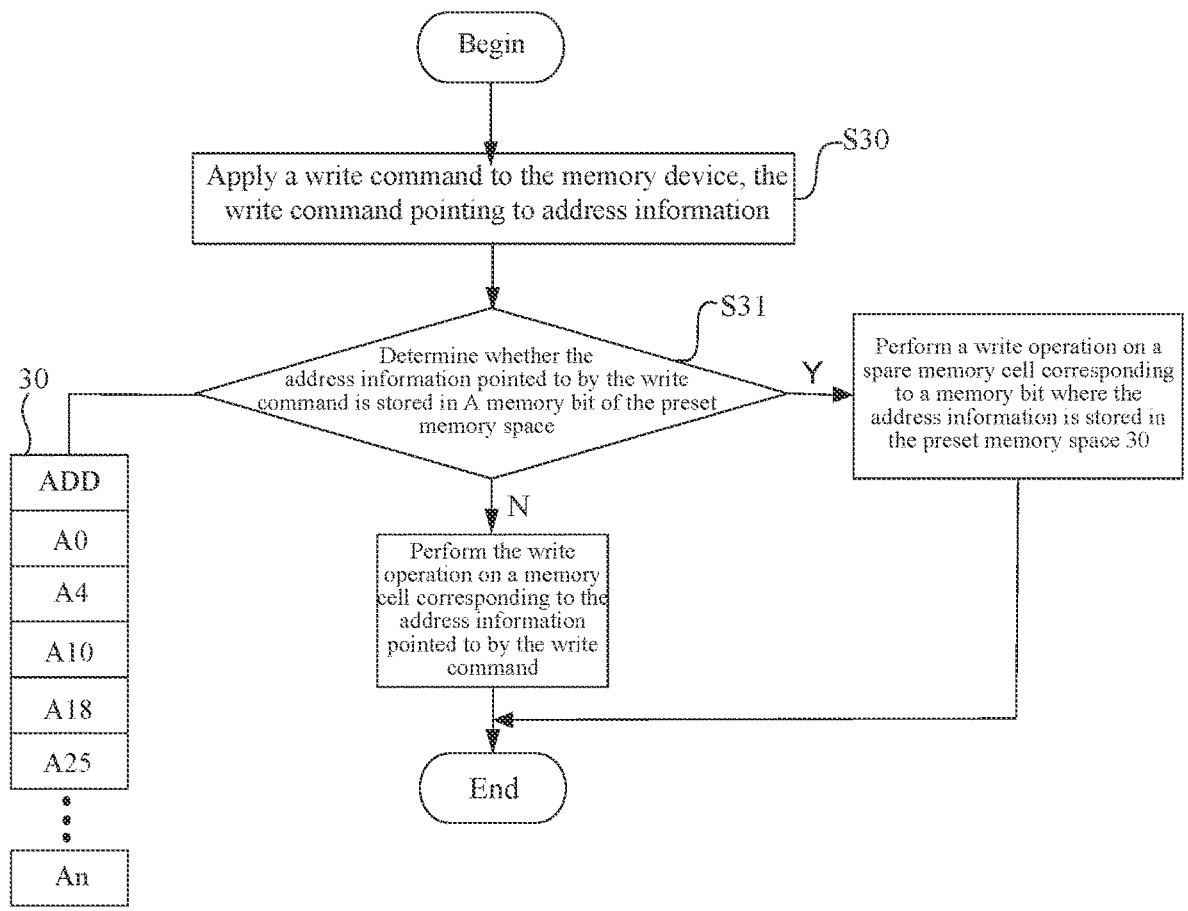
FIG. 3 is a schematic flow diagram of a method for reading and writing according to a third embodiment of the present disclosure.

The method for reading and writing provided by the present disclosure also provides a third embodiment. In the third embodiment, a write operation is performed on the memory device. In some embodiments, with reference to FIG. 3, a schematic flow diagram of the method for reading and writing according to the third embodiment of the present disclosure is illustrated.

In Step S30, a write command is applied to the memory device, wherein the write command points to address information. For example, a write command is applied to the memory device, wherein the write command points to address information A0.

In Step S31, the address information pointed to by the write command is compared with the address information stored in the preset memory space 30. That is, it is determined whether the address information pointed to by the write command is stored in a memory bit ADD of the preset memory space 30.

If the address information pointed to by the write command is different from the address information stored in the preset memory space 30, this means that the address information pointed to by the write command is not stored in the memory bit ADD of the preset memory space 30. In this case, a write operation is performed on a memory cell corresponding to the address information pointed to by the write command. If the address information pointed to by the write command is identical to the address information stored in the preset memory space 30, this means that the address information pointed to by the write command is stored in the memory bit ADD of the preset memory space 30. In this case, it is stopped performing the write operation on the memory cell corresponding to the address information pointed to by the write command, and the write operation is performed on a spare memory cell corresponding to a first memory bit ADD where the address information is stored in the preset memory space 30.

For example, the address information pointed to by the write command is address information A1, and the address information A1 is compared with the address information stored in the preset memory space 30. If the address information A1 is different from the address information stored in any memory bit ADD of the preset memory space 30, this means that the address information A1 pointed to by the write command is not stored in the memory bit ADD of the preset memory space 30. In this case, a write operation is performed on the memory cell corresponding to the address information A1 pointed to by the write command.

For another example, the address information pointed to by the write command is address information A4, and the address information A4 is compared with the address information stored in the preset memory space 30. If the address information A4 is identical to the address information stored in one memory bit ADD of the preset memory space 30, this means that the address information A4 pointed to by the write command is stored in the memory bit ADD of the preset memory space 30. In this case, it is stopped performing the write operation on the memory cell corresponding to the address information A4 pointed to by the write command, and the write operation is performed on the spare memory cell corresponding to the memory bit ADD where the address information A4 is stored in the preset memory space 30.

Further, in this third embodiment, the method for reading and writing also includes: forming a second ECC corresponding to data to be written in the write operation, and writing the second ECC together with the data to be written into the memory cell corresponding to the address information pointed to by the write command. When reading data in the memory cell, the data and the second ECC are read simultaneously, and the second ECC is decoded to restore data where an error likely occurs.

In this third embodiment, according to the method for reading and writing provided by the present disclosure, after a write command is applied to the memory device, the address information pointed to by the write command is compared with the address information stored in the preset memory space 30 to serve as a basis for performing a write operation on a memory cell or spare memory cell, thereby avoiding performing the write operation on an invalid memory cell. In this way, the reliability of the memory device is improved, and the lifespan of the memory device is prolonged.

The present disclosure also provides a memory device that can implement the above method for reading and writing. The memory device includes, but is not limited to, a volatile memory such as a dynamic random access memory (DRAM) and a static random access memory (SRAM), and to a non-volatile memory such as an NAND flash memory, an NOR flash memory, a ferroelectric random access memory (FeRAM), a resistance random access memory (RRAM), a magnetic random access memory (MRAM), and a phase change random access memory (PCRAM), etc.

Figure 4:
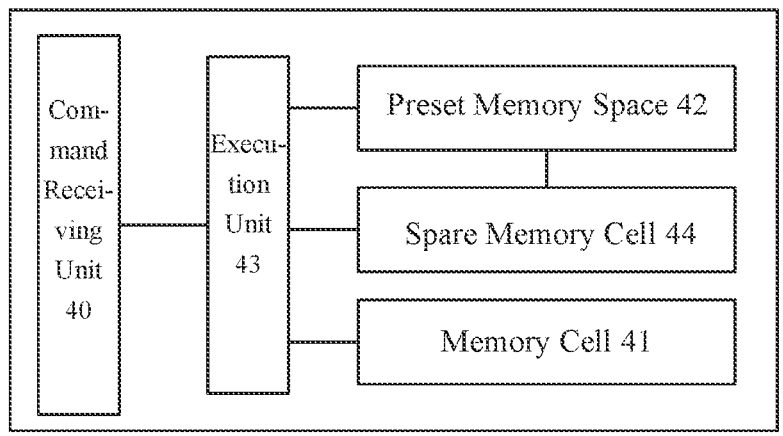
FIG. 4 is a schematic structural diagram of a memory device according to a first embodiment of the present disclosure.

With reference to FIG. 4, a schematic structural diagram of a memory device according to a first embodiment of the present disclosure is illustrated. The memory device includes: a command receiving unit 40, a memory cell 41, a preset memory space 42, an execution unit 43, and a spare memory cell 44.

The command receiving unit 40 is configured to receive a read command or write command applied to the memory device, or address information pointed to by the read command or write command.

The memory cell 41 corresponds to the address information pointed to by the read command or write command, and is configured to store data. In the present disclosure, the memory cell 41 may be a memory unit well known to those skilled in the art, such as a basic memory cell, a memory segment, memory pages, and memory blocks, which are not limited by the present disclosure.

The preset memory space 42 is provided with a plurality of memory bits configured for storing address information corresponding to a memory cell with data error, and each of the plurality of memory bits is associated with one spare memory cell. In other embodiments of the present disclosure, the preset memory space 42 is also configured to store an identification code, and the identification code is configured for identifying a spare memory cell.

The preset memory space 42 may be a structure having memory function known to those skilled in the art, such as a static random access memory (SRAM), a dynamic random access memory (DRAM), a magnetic random access memory (MRAM), a register, a latch, and a flip-flop, etc.

The execution unit 43 is configured to perform a read operation or a write operation on the memory cell 41. The execution unit 43 is also connected to the preset memory space 42, and is configured to selectively perform a read operation or a write operation on the memory cell 41 corresponding to the address information or the spare memory cell 44 according to a record of the preset memory space 42.

In some embodiments, if the address information pointed to by the read command or write command is different from address information stored in any memory bit of the preset memory space 42, the execution unit 43 performs the read operation or write operation on the memory cell corresponding to the address information. If the address information pointed to by the read command or write command is identical to the address information stored in a memory bit of the preset memory space 42, the execution unit 43 stops performing the read operation or write operation on the memory cell corresponding to the address information, and performs the read operation or write operation on a spare memory cell associated with the memory bit.

Figure 5:
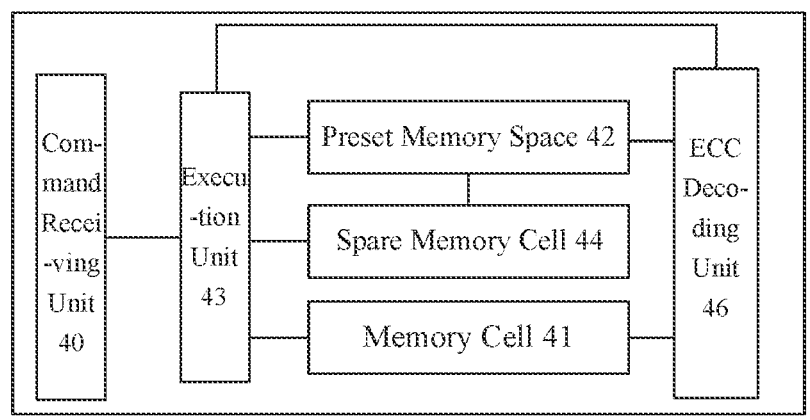
FIG. 5 is a schematic structural diagram of a memory device according to a second embodiment of the present disclosure.

The spare memory cell 44 is associated with a memory bit of the preset memory space 42, and is configured to store data. In the present disclosure, the spare memory cell 44 may be a memory unit well known to those skilled in the art, such as a basic memory cell, a memory segment, memory pages, and memory blocks, which are not limited by the present disclosure. Further, the memory device of the present disclosure also provides a second embodiment. With reference to FIG. 5, a schematic structural diagram of the memory device according to the second embodiment of the present disclosure is illustrated. The second embodiment differs from the first embodiment in that the memory device also includes an ECC decoding unit 46.

The ECC decoding unit 46 is connected to the execution unit 43, the memory cell 41, and the preset memory space 42.

The ECC decoding unit 46 is configured to decode the first ECC corresponding to the data to be read out in the read operation to restore data where an error likely occurs. Furthermore, a numerical code of the preset memory space 42 may be revised based on a fact whether the ECC decoding unit 46 restores the data. The ECC decoding unit 46 is also configured to form a second ECC corresponding to data to be written in the write operation.

In some embodiments, in this embodiment, the command receiving unit receives a write command. When performing the write operation on the memory cell corresponding to the address information pointed to by the write command, the ECC decoding unit 46 forms an ECC corresponding to data to be written in the write operation, and stores the ECC into the memory cell 41 corresponding to the address information pointed to by the write command. After the write operation is completed, when a subsequent read operation is performed on the memory cell corresponding to the address information, the ECC decoding unit 46 decodes the ECC. It may be determined whether an error occurs in the data to be read out read by the read operation according to decoding of the ECC decoding unit 46, and then it is determined whether the address information needs to be stored into a memory bit of the preset memory space 42.

Further, in this embodiment, it may be determined whether the address information needs to be stored into the preset memory space 42 based on a fact whether the ECC decoding unit 46 restores the data. In some embodiments, if the ECC decoding unit 46 decodes the ECC and restores the data, this means that an error occurs in the data to be read out read by the read operation. In this case, the address information of the memory cell is stored into the preset memory space 42. If the ECC decoding unit 46 decodes the ECC, but does not restore the data, this means that no error occurs in the data to be read out read by the read operation. In this case, the address information is not stored into the memory bit of the preset memory space 42.

In other embodiments of the present disclosure, the ECC decoding unit 46 decodes the ECC. Although the ECC decoding unit 46 does not restore the data, it may be still determined that an error occurs in the data to be read out read by the read operation according to decoding of the ECC decoding unit 46. In this case, the address information of the memory cell is stored into the memory bit of the preset memory space 42.

Figure 6:
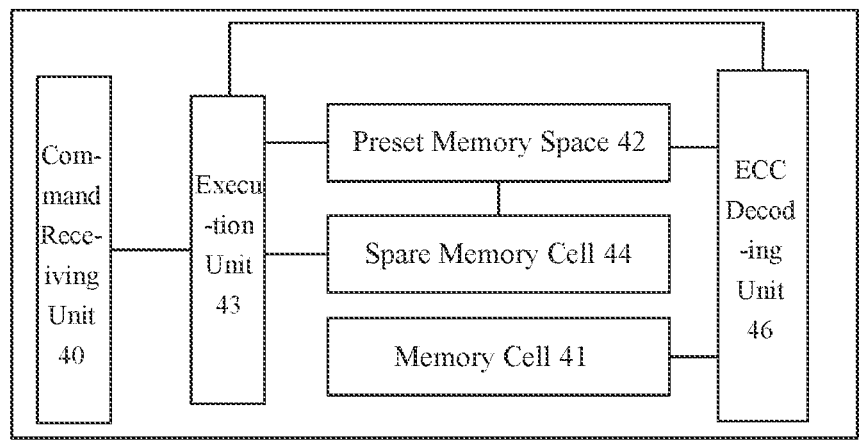
FIG. 6 is a schematic structural diagram of a memory device according to a third embodiment of the present disclosure.

In the second embodiment, the execution unit 43 not only is connected to the ECC decoding unit 46, but also is connected to the memory cell 41. However, in a third embodiment of the present disclosure, with reference to FIG. 6, a schematic structural diagram of the memory device according to the third embodiment, the execution unit 43 is connected to the ECC decoding unit 46, and the ECC decoding unit 46 is further connected to the memory cell 41. It is to be understood that different connection relationships may be selected according to different needs.

Figure 7:
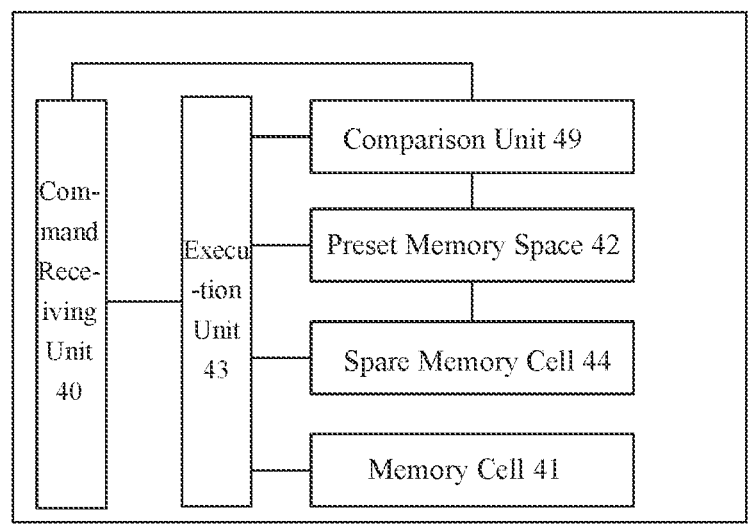
FIG. 7 is a schematic structural diagram of a memory device according to a fourth embodiment of the present disclosure.

The memory device of the present disclosure also provides a fourth embodiment. With reference to FIG. 7, a schematic structural diagram of the memory device according to the fourth embodiment of the present disclosure is illustrated. The fourth embodiment differs from the first embodiment in that the memory device also includes a comparison unit 49. The comparison unit 49 is connected to the command receiving unit 40 and the preset memory space 42, and the comparison unit 49 is configured to compare the address information pointed to by the read command or write command with the address information stored in the preset memory space 42.

The execution unit 43 is also connected to the comparison unit 49. The execution unit 43 can perform a read operation or a write operation on the memory cell corresponding to the address information pointed to by the read command or write command according to a result outputted by the comparison unit 49, or the execution unit 43 stops performing the read operation or the write operation on the memory cell corresponding to the address information pointed to by the read command or write command, and performs the read operation or write operation on the spare memory cell identified by an identification code corresponding to the address information.

For example, the comparison unit 49 compares the address information pointed to by the read command or write command with the address information stored in the preset memory space 42. If the address information pointed to by the read command or write command is different from the address information stored in any memory bit of the preset memory space 42, the comparison unit 49 outputs a signal indicating DIFFERENT to the execution unit 43, such that the execution unit 43 performs, according to the signal, the read operation or write operation on the memory cell corresponding to the address information pointed to by the read command or write command. If the address information pointed to by the read command or write command is identical to the address information stored in a memory bit of the preset memory space 42, the comparison unit 49 outputs a signal indicating SAME to the execution unit 43, such that the execution unit 43 stops performing, according to the signal, the read operation or write operation on the memory cell corresponding to the address information pointed to by the read command or write command, and performs the read operation or write operation on the spare memory cell associated with the memory bit.

Figure 8:
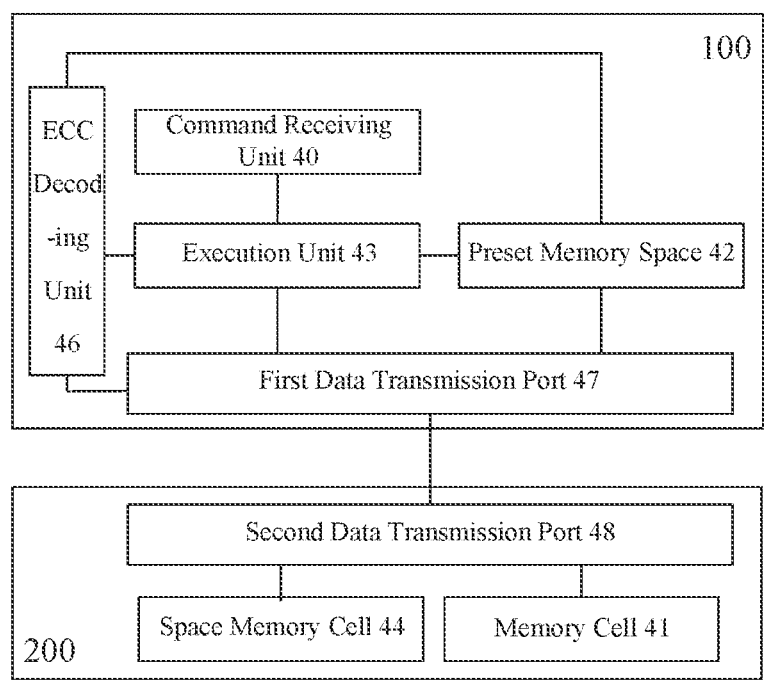
FIG. 8 is a schematic structural diagram of a memory device according to a fifth embodiment of the present disclosure.

The memory device of the present disclosure also provides a fifth embodiment. With reference to FIG. 8, a schematic structural diagram of the memory device according to the fifth embodiment of the present disclosure is illustrated. The fifth embodiment differs from the second embodiment in that the memory device also includes a logic layer 100 and a plurality of memory layers 200 (only one memory layer is shown in FIG. 8). The plurality of memory layers 200 may be DRAM chips, and the logic layer 100 may be a layer provided with a logic circuit, such as a control chip or an interposer. The plurality of memory layers 200 may be vertically stacked above or below the logic layer 100, but the present disclosure is not limited thereto. Furthermore, the plurality of memory layers 200 may be integrated together using other packaging methods.

The command receiving unit 40, the preset memory space 42, the execution unit 43 and the ECC decoding unit 46 may be all arranged in the logic layer 100. The memory cell 41 and the spare memory cell 44 are arranged in the first memory layer 200. In another embodiment of the present disclosure, the preset memory space 42 and the ECC decoding unit 46 may also be arranged in the first memory layer 200.

In this embodiment, the logic layer 100 has at least one first data transmission port 47, and the first memory layer 200 has at least one second data transmission port 48. Instructions and data are transmitted between the logic layer 100 and the plurality of memory layers 200 through the first data transmission port 47 and the second data transmission port 48.

Further, in the fifth embodiment, the execution unit 43 not only is connected to the ECC decoding unit 46, but also is connected to the memory cell 41 through the first data transmission port 47 and the second data transmission port 48. However, in a sixth embodiment of the present disclosure, the execution unit 43 is connected to the ECC decoding unit 46, and the ECC decoding unit 46 is connected to the memory cell 41 through the first data transmission port 47 and the second data transmission port 48. It is to be understood that different connection relationships may be selected according to different needs. It is to be noted that although embodiments of the connection relationships are provided in the above drawings, the present disclosure does not limit the connection manner. It is to be understood that those skilled in the art may select different connection relationships according to different needs.

The memory device of the present disclosure can differentiate address information of an invalid memory cell from address information of a valid memory cell by using the preset memory space when the user uses the memory device, and the invalid memory cell can be replaced by the spare memory cell, such that a read/write operation may be selectively performed on the memory cell or the spare memory cell. In this way, the reliability of the memory device is greatly improved, and the lifespan of the memory device is greatly prolonged.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A method for reading and writing, comprising:
    applying a read command to a memory device, the read command pointing to address information;
    reading data to be read out from a memory cell corresponding to the address information pointed to by the read command; and
    storing the address information pointed to by the read command into a memory bit of a preset memory space if an error occurs in the data to be read out, wherein the preset memory space is provided with a plurality of memory bits, and each of the plurality of memory bits being associated with a spare memory cell;
    applying a write command to the memory device, and comparing address information pointed to by the write command with the address information stored in the preset memory space;
    performing a write operation on the memory cell corresponding to the address information pointed to by the write command if the address information pointed to by the write command is different from the address information stored in the preset memory space; and
    stopping performing the write operation on the memory cell corresponding to the address information pointed to by the write command, and performing a write operation on the spare memory cell corresponding to a first memory bit where the address information is stored in the preset memory space if the address information pointed to by the write command is identical to the address information stored in the preset memory space.

2. The method for reading and writing according to claim 1, wherein the address information pointed to by the read command is not stored in the memory bit of the preset memory space if no error occurs in the data to be read out.

3. The method for reading and writing according to claim 1, wherein the reading data to be read out from a memory cell corresponding to the address information pointed to by the read command further comprises: reading, from the memory cell corresponding to the address information pointed to by the read command, a first error correction code (ECC) corresponding to the data to be read out; and
    wherein a method for determining whether an error occurs in the data to be read out comprises: decoding the first ECC to determine whether the error occurs in the data to be read out.

4. The method for reading and writing according to claim 1, wherein the performing a write operation on the memory cell corresponding to the address information pointed to by the write command further comprises:
    forming a second ECC corresponding to data to be written in the write operation, and writing the second ECC together with the data to be written into the memory cell corresponding to the address information pointed to by the write command.

5. The method for reading and writing according to claim 1, wherein after the applying a read command to the memory device, and before the reading data to be read out from a memory cell corresponding to the address information pointed to by the read command, the method further comprises:
    comparing address information pointed to by the read command with the address information stored in the preset memory space; and performing a read operation on the memory cell corresponding to the address information pointed to by the read command if the address information pointed to by the read command is different from the address information stored in the preset memory space.

6. The method for reading and writing according to claim 5, comprising:
stopping performing the read operation on the memory cell corresponding to the address information pointed to by the read command, and performing a read operation on the spare memory cell corresponding to a first memory bit where the address information is stored in the preset memory space if the address information pointed to by the read command is identical to the address information stored in the preset memory space.

7. The method for reading and writing according to claim 1, wherein when the error occurs in the data to be read out, if the data to be read out is corrected, the corrected data is stored into the spare memory cell; and if the data to be read out is not corrected, the data to be read out is stored into the spare memory cell.

8. A memory device, comprising:
a command receiving unit, configured to receive a read command or a write command;
a memory cell, configured to correspond to address information pointed to by the read command or write command;
a spare memory cell;
a preset memory space, provided with a plurality of memory bits configured for storing address information corresponding to a memory cell with data error, each of the plurality of memory bits being associated with one spare memory cell; and
an execution unit, configured to perform a read operation or a write operation on the memory cell or the spare memory cell;
a comparison unit, wherein the comparison unit is connected to the command receiving unit and the preset memory space, and the comparison unit is configured to compare the address information pointed to by the read command or write command with the address information stored in the preset memory space;
wherein the execution unit is further connected to the comparison unit, and the execution unit is configured to:
perform a read operation or a write operation on the memory cell corresponding to the address information pointed to by the read command or write command according to a result outputted by the comparison unit;
stop performing the read operation or the write operation on the memory cell corresponding to the address information pointed to by the read command or write command; and
perform the read operation or the write operation on the spare memory cell corresponding to a first memory bit where the address information is stored in the preset memory space.

9. The memory device according to claim 8, further comprising an ECC decoding unit, configured to decode a first ECC corresponding to data to be read out in the read operation and to form a second ECC corresponding to data to be written in the write operation.

10. The memory device according to claim 8, comprising a logic layer and at least one memory layer, wherein the command receiving unit and the execution unit are arranged in the logic layer, the preset memory space being arranged in the logic layer or the memory layer, the memory cell being arranged in the memory layer, and the spare memory cell being arranged in the memory layer or the logic layer.

* * * * *